United States Patent [19]
Hughes et al.

[11] Patent Number: 5,215,420
[45] Date of Patent: Jun. 1, 1993

[54] SUBSTRATE HANDLING AND PROCESSING SYSTEM

[75] Inventors: John L. Hughes, Rodeo; Eric C. Lawson, Sunnyvale, both of Calif.

[73] Assignee: Intevac, Inc., Santa Clara, Calif.

[21] Appl. No.: 763,183

[22] Filed: Sep. 20, 1991

[51] Int. Cl.$^5$ ............................................. B65G 47/00
[52] U.S. Cl. .................................... 414/217; 118/719;
 204/298.25; 414/417; 414/DIG. 5; 414/DIG. 3
[58] Field of Search ............... 414/225, 222, 217, 416,
 414/417, 403, 404, DIG. 1, DIG. 3, DIG. 4,
 DIG. 5, DIG. 7; 204/298.25, 298.26; 118/500,
 719

[56] References Cited

U.S. PATENT DOCUMENTS

| | | | |
|---|---|---|---|
| 4,449,885 | 5/1984 | Hertel et al. | 414/417 X |
| 4,500,407 | 2/1985 | Boys et al. | 414/217 X |
| 4,776,744 | 10/1988 | Stonestreet et al. | 414/217 |
| 4,790,921 | 12/1988 | Bloomquist et al. | 414/217 X |
| 4,795,299 | 1/1989 | Boys et al. | 414/417 X |
| 4,886,592 | 12/1989 | Anderle et al. | 118/719 X |
| 4,909,695 | 3/1990 | Hurwitt et al. | 414/217 |
| 4,981,408 | 1/1991 | Hughes et al. | 118/719 X |

FOREIGN PATENT DOCUMENTS

| | | | |
|---|---|---|---|
| 89881 | 4/1987 | Japan | 204/298.25 |
| 22413 | 1/1991 | Japan | 118/719 |
| 3-056668 | 3/1991 | Japan | 204/298.25 |
| 2171119 | 8/1986 | United Kingdom | 414/217 |

OTHER PUBLICATIONS

IBM Technical Disclosure Bulletin-vol. 11, No. 7, Dec. 1968, pp. 757 & 758.

Primary Examiner—Frank E. Werner
Attorney, Agent, or Firm—Stanley Z. Cole

[57] ABSTRACT

A system for handling and processing thin substrates, such as substrates for magnetic disks. The system includes a main chamber, entrance and output load locks, a buffer chamber, substrate load/unload mechanism, and a plurality of substrate processing stations positioned contiguous with the main vacuum chamber. The system further includes a transport for moving a plurality of cassettes carrying vertically oriented substrates into the entrance load lock, to the buffer chamber where the substrates are transferred into the main chamber, and to the output load lock where processed substrates are placed back in the cassettes. The substrates are transferred to and from the cassettes to and from the substrate load/unload mechanism by means of dedicated lift blades. The system further employs a simple three-step transfer of the substrates from processing station to processing station which greatly increases the throughput potential compared to prior art systems which rely on complex substrate handling and transfer.

29 Claims, 5 Drawing Sheets

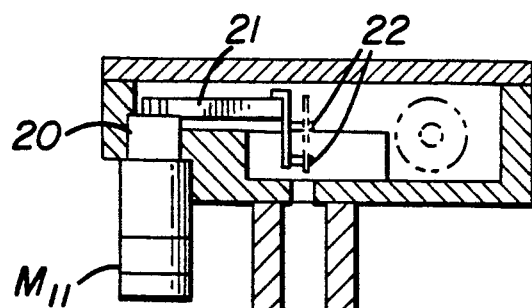
FIGURE 2A
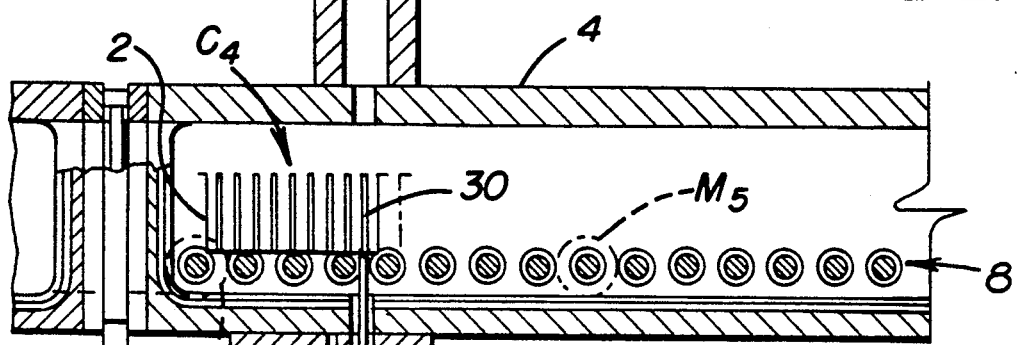
FIGURE 2B
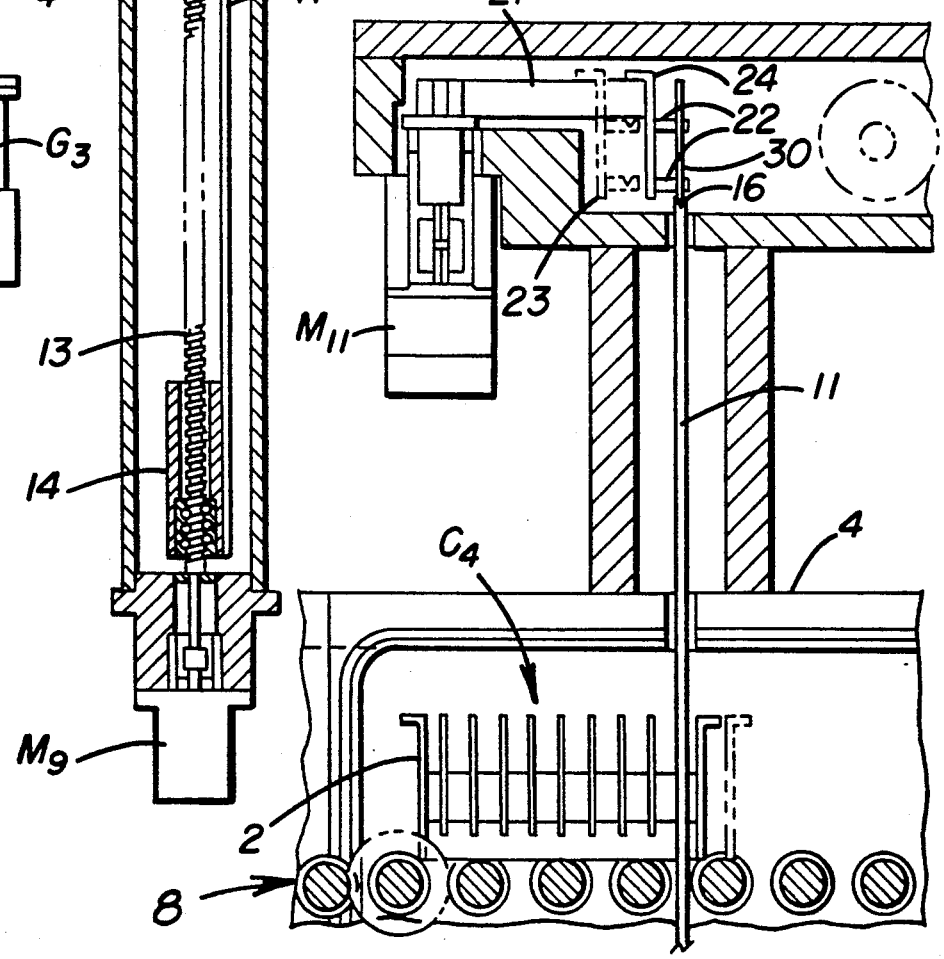

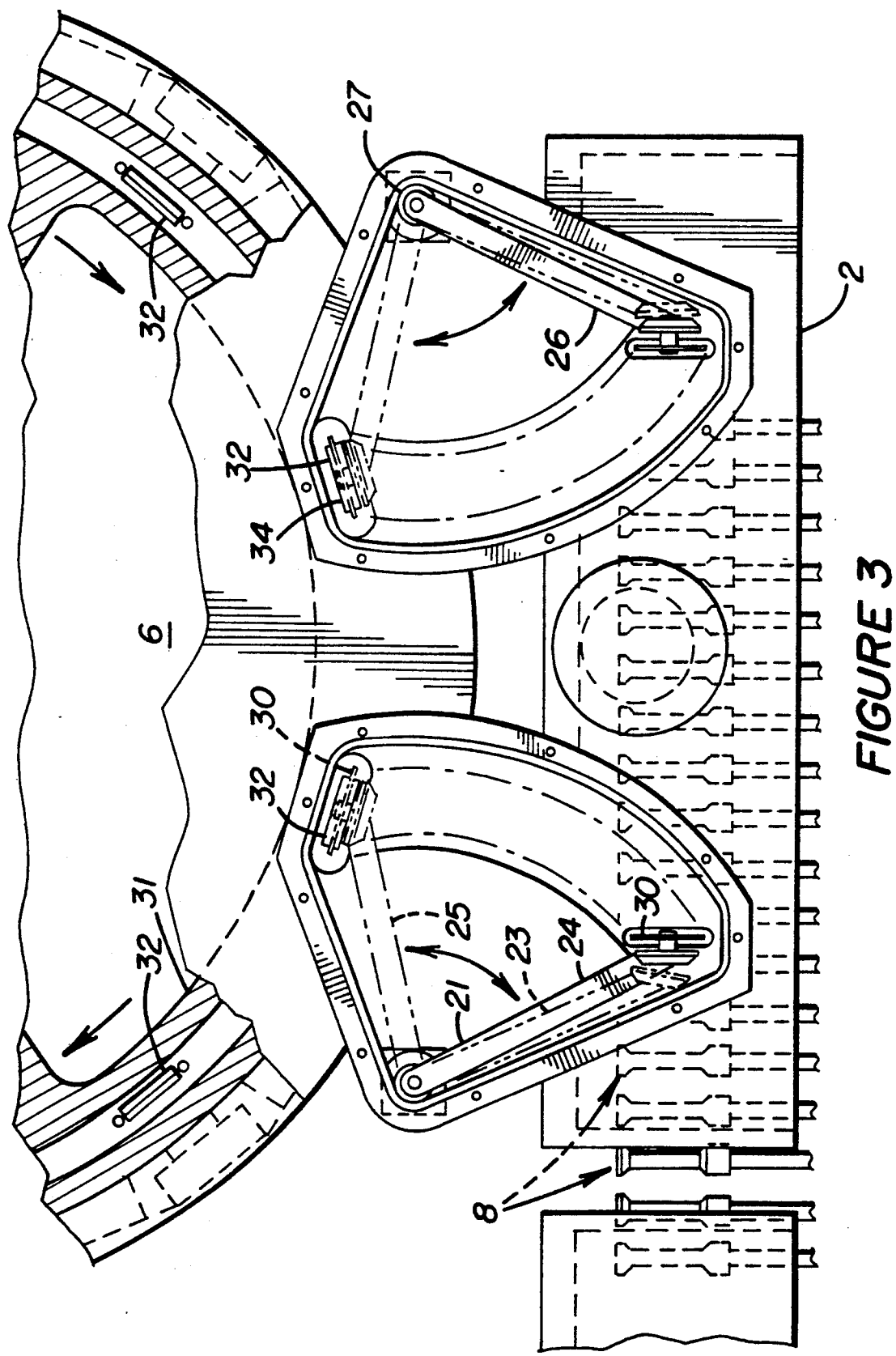

SUBSTRATE HANDLING AND PROCESSING SYSTEM

FIELD OF THE INVENTION

This invention relates to the art of handling and processing thin substrates such as substrates for magnetic disks. More particularly, the invention relates to an improved system for simultaneously processing vertically oriented disklike substrates sequentially in each of several processing stations.

BACKGROUND OF THE INVENTION

It has become increasingly important to transport thin workpieces, such as substrates for magnetic disks, from a cassette into, through and out of a vacuum processing system, and back into a cassette. An illustrative system is described in U.S. Pat. No. 4,981,408. The system disclosed in the noted patent includes a plurality of substrate processing stations which are designed to accommodate two vertically oriented workpieces and a transport system that simultaneously advances two workpieces from an entrance load lock sequentially through the plurality of processing stations to an exit load lock.

The aforementioned system is now available in commercial equipment from Intevac, Inc. of Santa Clara, CA. The market place continues to demand higher output than present day units can achieve and equipment capable of processing smaller diameter workpieces. In this respect the needs of the computer industry to obtain smaller and smaller subsystems is well known to all.

In U.S. Pat. Nos. 4,311,427 and 4,749,465, similar vacuum processing systems are disclosed wherein individual substrates are processed while in a common vacuum environment. In the noted patents, as in many coating systems which employ a substrate transport system, the various fixed and moving parts of the transport system frequently become at least partially coated incidentally along with the substrate. The flaking of deposited material from the transport system, especially from the moving parts, leads to the generation of particulates which may be detrimental to the substrates. This leads to the need for frequent, and sometimes extensive, servicing of the noted substrate transport systems.

The throughput potential of existing systems, and the disclosed invention, is directly controlled by process and transport cycle time. A decrease in the time to transfer a substrate from one process station to another yields an equal decrease in the time required for the system to fully process one substrate. Throughput potential is also affected by the time to transfer individual substrates from and to the load locks. This transfer time, which includes load lock venting and pumping, limits the throughput potential. Also, the quick venting and rough vacuum pump-down required to load individual substrates into a vacuum environment increase particulate contamination in the disk vicinity.

Prior art systems require multiple motions and substrate manipulations to perform a process station to process station transfer, thereby increasing transport cycle time. The systems further require individual substrate loading and unloading which decreases throughput potential and increases particulate dispersal.

Higher throughput systems, as are commonly employed in production environments, employed pass through techniques which have provided satisfactory throughput. However, the higher throughput is achieved by virtue of the continuous engagement of deposition sources.

Further, coating quality is sacrificed to achieve the enhanced throughput. Coating quality is adversely effected in such systems as a result of substrate motion during coating and varied deposition rate associated with substrate entry and exit from the deposition zone while the deposition sources are engaged.

Additional disadvantages of higher throughput systems is condensate flaking from substrate holders and the release of absorbed water vapor from condensate on substrate holders which enter and exit the system with the substrate(s).

Accordingly, it is an object of the invention to provide a substrate handling and processing system with a superior throughput potential.

It is a further object of the invention to provide a system for serially processing substrates individually on a continuous basis, with a plurality of processing stations operating simultaneously on individual substrates.

A related object of the invention is to provide a system for processing individual substrates in isolation from all other processes.

Yet another object of the invention is to provide a load lock type system which accomplishes transport of cassettes to and from a vacuum environment, in which loading and unloading of individual substrates contained therein may be accomplished while other substrates are being processed.

Yet another related object is to provide a system as above which provides for a slow load lock pumpout rate, significantly reducing air disturbance and particulate contamination within the locks.

A further related object is to provide a system as above which is compatible with automatic substrate handling from and to the cassettes.

Yet a further object of the invention is to provide a system for production-line use in which reliability, maintainability, and ease of use and product quality are enhanced.

SUMMARY OF THE INVENTION

The disclosed handling and processing system substantially reduces or eliminates the disadvantages and shortcomings associated with the prior art techniques. The disclosed system maximizes the throughput of single substrate handling equipment by significantly reducing the number of transport motions required by prior art systems. The system also enhances coating quality by eliminating coating directional motion effects and variations in deposition rate, and virtually eliminates water vapor and flaking generation associated with conventional substrate holders by elimination of the holders themselves.

The disclosed system employs an entrance and output load lock, and a buffer chamber wherein cassettes containing vertically oriented substrates may be introduced into the system and the substrates effectively transferred out of the cassettes and into the main vacuum chamber of the system while under vacuum and while other substrates are being sequentially processed therein. The system further employs a simple three step transfer of substrates from processing station to processing station which greatly increases the throughput potential compared to prior art system which rely on complex substrate handling and transfer.

The disclosed system includes a main vacuum chamber with a plurality of processing stations contiguous therewith. The system further includes a conveyer roller assembly for moving a plurality of cassettes carrying vertically oriented substrates. The conveyer assembly further includes an entrance load lock, buffer chamber, and an output load lock along its length. During transport of a cassette along the conveyer assembly, the cassette is initially moved into the entrance load lock station. The load lock is then pumped down to effect a vacuum environment. The cassette is then transferred out of the entrance load lock into the buffer chamber which is maintained at high vacuum and in communications with the main vacuum chamber.

The disclosed system further includes a vertical transport system situated beneath the conveyor assembly and extendable through the bottom surface of the cassettes. The vertical transport system includes a plurality of lift blades to transport individual substrates to and from the cassettes to and from a buffer chamber transfer position above the cassettes. The lift blades are designed and configured to symmetrically engage an individual substrate near the lower half of its periphery, holding the substrate securely with the aid of gravity, and negligibly eclipsing either substrate surface.

The disclosed handing and processing system is further provided with novel substrate load and unload means which employ a simple single plane rotational translation. The load means is designed and positioned to engage an individual substrate, when in the transfer position, and transport the substrate to the main chamber transport assembly. The unload means is designed and positioned to engage an individual substrate after processing and to transfer the processed substrate to the transfer position within the buffer chamber, wherein the vertical transport system engages the processed substrate and lowers the substrate into an exit cassette.

Thus, in the disclosed system, substrates are transferred from, processed and transferred back to, a cassette in a vacuum environment, avoiding the need to load and unload individual substrates into the atmosphere. Accordingly, throughput is significantly enhanced and the potential for particulate contamination greatly reduced.

The novel main chamber transport assembly of the invention is designed and configured to engage the substrate and effect transfer of the substrate from processing station to processing station. The main chamber transport assembly is provided with both circular indexing and vertical motion to simultaneously transfer a plurality of substrates from process station to process station. During transport and processing, the substrates are positioned in pedestals which are positioned near the perimeter of the main chamber transport assembly, and the substrates are transferred from process station to process station with a simple down-index-up sequence of motions, remaining on the same pedestal throughout the process sequence.

Associated with each of the pedestals is a sealing means such that when the main chamber transport assembly is in the elevated position each processing station is isolated from the others and the load locks, buffer chamber, and processing stations are isolated from the main vacuum chamber. Roughing pump vacuum is available to each of the load locks and processing stations, and each processing station may be provided with a dedicated high vacuum pump, which may be valved in or out as required. The various processing stations are thus isolated one from another during operation, thereby avoiding or greatly reducing cross-contamination. With the main chamber transport assembly in the lowered position during periods of non-operation (or indexing) of the assembly, the processing stations and the buffer chamber share the common vacuum of the main chamber.

Additional benefits accrue from having the individual processing stations isolated during their operation. One is that incidental coating of the main chamber transport assembly is limited to the pedestals. As a result, the generation of substrate-contaminating particulates is greatly reduced, which reduces correspondingly the need for servicing of the main chamber transport assembly. Others are that different sputtering gas pressures can be used in each sputtering process station, or different gases may be employed to optimize each process step.

BRIEF DESCRIPTION OF THE DRAWINGS

Further features and advantages will become apparent from the following and more particular description of the preferred embodiment of the invention, as illustrated in the accompanying drawings, in which like referenced characters generally refer to the same parts or elements throughout the views, in which:

FIGS. 2A and 2B are cross-sectional breakaway views of the assembly of FIG. 1, illustrating the vertical transport of substrates according to the present invention;

FIG. 3 is a schematic plan view illustrating the transport system employed to transfer substrates to and from the cassettes into and out of the main vacuum chamber, according to the present invention;

DETAILED DESCRIPTION OF THE INVENTION

In accordance with the present invention, the disclosed substrate handling and processing system substantially reduces or eliminates the disadvantages and shortcomings associated with the prior art techniques. According to the invention, an entrance load lock, a buffer chamber, and an output load lock are provided for effectively transferring cassettes, supporting vertically oriented substrates, into and out of the system, and a vertical transport assembly and buffer chamber load-/unload assembly to facilitate the transfer of substrates out of the cassettes and into the main vacuum chamber while other substrates are being processed in the plurality of processing stations therein. Another highly important technical advantage of the invention is the simple three step main chamber transport system which isolates individual processing stations and greatly enhances throughput potential of the system and substantially reduces particulate contamination.

Figure 1:
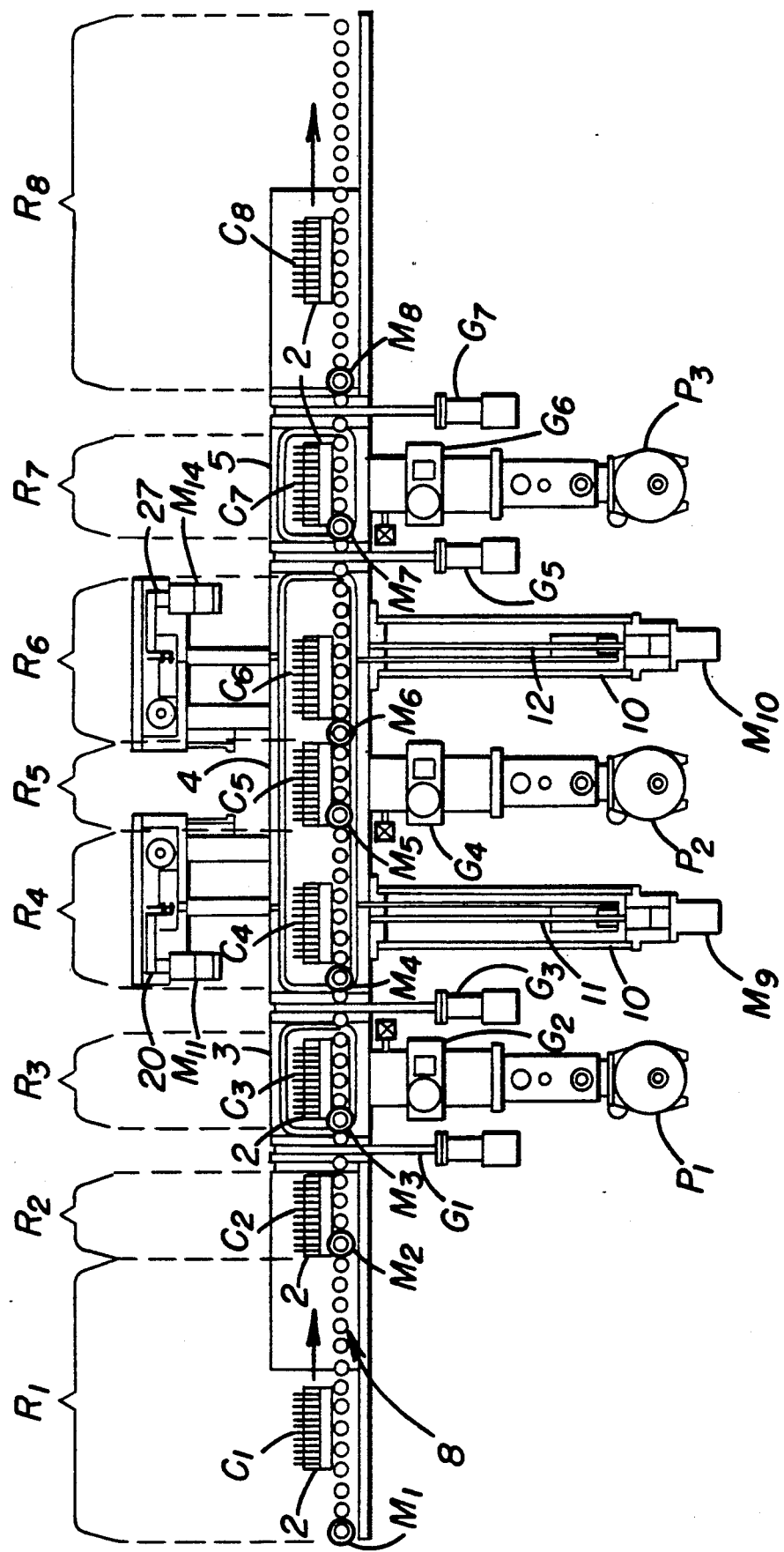
FIG. 1 illustrates a cross-sectional view of the cassette conveyer assembly according to the present invention.

FIG. 1 is a simplified sectional view of one embodiment of the present invention for handling and processing a plurality of thin, vertically oriented substrates which may be computer memory disks or magnetic optic disks. FIG. 1 provides an overview of the operations of the handling and processing system. The description of the mechanisms employed to achieve these operations is provided in connection with subsequent figures.

FIG. 1 shows the flow pattern of N (where N is an integer greater than 1) substrates through the horizontal conveyer system. The conveyer system 1 includes a spaced series of rollers 8 which are designed, positioned, and dimensioned to accommodate a plurality of cassettes 2. The cassettes, shown in positions $C_1$-$C_8$, are advanced along the conveyer system 1 wherein unprocessed substrates are unloaded and processed substrates are loaded as follows: In the preferred embodiment of the invention, motive power for the movement of the cassettes 2 is provided by a plurality of motors $M_1$-$M_8$ and conventional gear arrangements operatively connected to roller sets $R_1$-$R_8$ or other transport means. By way of example, at the entrance of the conveyor system 1, motors $M_1$ and $M_2$ drive synchronously roller sets $R_1$ and $R_2$ and move an entrance cassette 2 which is full of unprocessed substrates from position $C_1$ to position $C_2$.

The entrance load lock 3 is then slowly vented to atmospheric pressure (i.e. less than 760 Torr. per min.) with an inert gas, such as nitrogen. Gate valve assembly $G_1$ is opened, opening the entrance load lock door assembly (not shown), and allowing access of the entrance cassette 2 to the entrance load lock 3. Continuing this example, motors $M_2$ and $M_3$ drive synchronously roller sets $R_2$ and $R_3$ moving the cassette from position $C_2$ to position $C_3$. Gate valve assembly $G_1$ is then closed, closing the entrance load lock door assembly so that the entrance load lock door seals against the entrance load lock frame assembly, forming a sealed entrance load lock chamber. The entrance load lock 3 is then rough-pumped slowly (i.e. less than 760 Torr. per min.) via a conventional vacuum pump (not shown) and then pumped to very low vacuum (i.e. $10^{-6}$ Torr.) via gate valve assembly $G_2$ and conventional high vacuum pump (cyropump) $P_1$.

Gate valve assembly $G_3$ is opened, opening a common door assembly (not shown) between the entrance load lock 3 and the buffer chamber 4 and allowing access of the cassette 2 to the buffer chamber 4. Buffer chamber 4 is in selective communication with the main vacuum chamber 6 of the system (when the main chamber transport assembly 31 is in the lowered position, as disclosed in detail herein) and is under continuous high vacuum by virtue of gate valve assembly $G_4$ and high vacuum cyropump $P_2$. Since a vacuum environment has been achieved in the load lock 3, opening the common door assembly does not appreciably disturb the buffer chamber 4 or main vacuum chamber 6 environment. Further, creating the vacuum environment in the entrance load lock 3 is effectively achieved in a short time frame because the load lock 3 is of such small volume compared to the main vacuum chamber 6. Thus, system cycle and process time as compared to the prior art systems is greatly reduced, significantly enhancing throughput.

Continuing this example, motors $M_3$ and $M_4$ then drive synchronously roller sets $R_3$ and $R_4$ to move the cassette from position $C_3$ to position $C_4$ in buffer chamber 4. Gate valve assembly $G_3$ is closed, closing the common door assembly between the entrance load lock 3 and the buffer chamber 4, and isolating the entrance load lock 3 from the buffer chamber 4.

To position a substrate for transport into the system, motor $M_4$, for example, drives roller set $R_4$ to advance the cassette in position $C_4$ by one slot, positioning the first substrate to be processed into registration over the path of the input lift blade 11 of the vertical transport system 10. During the advance of cassettes 2, the input lift blade 11 and output lift blade 12 are in their retracted position as illustrated in FIG. 2A and discussed in detail herein. The cassettes 2 hold a plurality of substrates in spaced, facing, aligned and parallel relationship, and contain an opening over a substantial portion of their bottom surface to permit access of the input 11 and output lift blades 12.

After gate valve assembly $G_3$ is actuated, isolating the entrance load lock 3 and buffer chamber 4, the load lock 3 is again vented to atmosphere. Gate valve assembly $G_1$ re-opens, opening the entrance load lock door assembly, and a subsequent cassette 2 full of unprocessed substrates moves from position $C_2$ to $C_3$. Gate valve assembly $G_1$ is then closed, closing entrance load lock door assembly, and the entrance load lock 3 is rough pumped slowly and then pumped to very low vacuum.

In the preferred embodiment of the invention, the vertical transport system 10 includes an input lift blade (load) 11 and an output lift blade (unload) 12. The vertical transport system 10 is positioned below the buffer chamber 4 and further includes a pair of actuating screws 13 and ball-nuts 14 (see FIG. 2A), and drive motors $M_9$ and $M_{10}$. Vertical translation of the lift blades 11, 12 is effectuated by actuating the motors $M_9$ and $M_{10}$ which turn individual actuating screws 13, raising and lowering each ball-nut 14, with a dedicated ball-nut 14 operatively connected to each lift blade 11, 12.

The lift blades 11, 12 are guided for movement up and down in a vertical path intersecting the conveyer system 1 at right angles. The width of the blades 11, 12 is less than that of the spacing between the main walls of the cassettes 2 which hold the substrates. The blades 11, 12 are also thinner than the spacing between adjacent substrates retained in the cassettes 2.

Lift blades 11, 12 are further provided with an arcuate upper end 15 shaped to match the curvature of the substrates (see FIG. 4), and a V-groove 16 within this end to retain individual substrates edgewise therewithin (see FIG. 2B). Thus, to transfer an unprocessed substrate 30 from an entrance cassette 2 in position $C_4$ to vertical transfer position (see FIG. 2B), upon actuation of motor $M_4$ bringing a cassette 2 and substrate 30 into registration over the path of the blade 11, the input blade 11 passes between the conveyor system rollers 8 and intersects the conveyer and cassette 2 at right angles thereto. As the cassettes 2 are constructed to allow access from below to the substrates, and to allow the lift blades 11, 12 to pass completely therethrough, upon placing a cassette 2 and substrate in registration over the path of the input lift blade 11, the blade 11 moves upwardly between the conveyer rollers 8 to engage from below a substrate 30 within the V-groove of its upper end 16, elevating the substrate 30 upwardly to a position in registration immediately adjacent the buffer chamber load assembly 20 (see FIG. 2B.).

Since the substrates are vertically oriented, gravity aids in holding the substrates firmly yet gently and securely in the grooved end 16 of the lift blades 11, 12. Contact with the front face of the substrate or magnetic disks is therefore virtually eliminated, unlike the case of typical automated handling when the substrate is in a horizontal orientation. Thus, the risk of damage or abrasion to the substrate is greatly reduced.

After the substrate 30 is raised to the vertical transfer position, as illustrated in FIG. 2B, the substrate 30 is engaged by the buffer chamber load assembly 20 and the input lift blade 11 retracted, as shown in FIG. 2A. Motor $M_4$ subsequently moves cassette $C_4$, aligning the next substrate over the input lift blade 11.

Substrates are transferred from the cassettes 2, as described above, until all substrates are unloaded. Motors $M_4$ and $M_5$, for example, then synchronously drive roller sets $R_4$ and $R_5$, moving the empty cassette 2 to position $C_5$. The empty cassette 2 remains in position $C_5$ until the preceding cassette in position $C_6$ is filled with processed substrates (as described herein) and moved out of the buffer chamber 4.

Prior to unloading substrates into the cassette in position $C_5$, motors $M_5$ and $M_6$ synchronously drive roller sets $R_5$ and $R_6$, moving the empty cassette to position $C_6$ where the first empty slot of the cassette is aligned directly over the path of the output lift blade 12.

The buffer chamber load assembly 20 of the system includes a lever arm 21 with a plurality of grooved members 22 operatively attached to one end thereof. In the preferred embodiment, the lever arm 21 includes three grooved members 22 positioned such that one of the grooved members 22 engages the substrate at the upper edge of the substrate's internal opening, and the two remaining members 22 engage the substrate at its lower edge (see FIG. 4.). In another embodiment of the invention, not shown, the arm 21 may include two grooved members 22 designed and configured to engage the lower edge of an individual substrate.

The buffer chamber load assembly 20 further includes a drive motor $M_{11}$, and a conventional gear assembly (not shown) to effectuate rotational translation of the lever arm 21 to and from the buffer chamber 4 to the main vacuum chamber 6 of the system (see FIG. 3.).

The buffer chamber load assembly lever arm 21 is designed and positioned such that the arm moves to a position 23 immediately adjacent to the substrate 30 in the vertical transfer position, shown in phantom in FIGS. 2B and 3. To transfer the substrate 30 from the buffer chamber 4 to the main vacuum chamber 6, the lever arm 21 is moved from its standby position 23 to position 24 via motor $M_{11}$ wherein the grooved members 22 of the lever arm 21 align with the substrate 30, and the input lift blade 11 retracts allowing substrate 30 to engage the grooved members 22 of the lever arm 21. (See FIG. 2B.) The lever arm 21 is then further rotated to position 25 (also shown in phantom in FIG. 3) where the substrate 30 is transferred to the main chamber transport assembly 31 disposed within the main vacuum chamber 5. Thus, the substrate is effectively transferred in a sealed vacuum environment from the buffer chamber 4 to the main vacuum chamber 6 by a simple single plane rotational translation of the lever arm 21, which significantly enhances throughput.

The substrate 30 is transferred to the main chamber transport assembly 31, processed and unloaded as follows: Motor $M_{10}$ rotates lever arm 21 and unprocessed substrate 30 to position 25 above and immediately adjacent to one of a plurality of pedestals 32 positioned on the main chamber transport assembly 31. The pedestals 32 are provided with an arcuate upper end shaped to match the curvature of the substrates 30, and also V-grooved 35 within this end to retain an individual substrate 30 edgewise therewithin during transfer of the substrates from processing station to processing station and during processing of the substrates (see FIG. 4.).

In the preferred embodiment of the invention, the pedestals 32 are further provided with a novel sealing system which effectively seals and isolates each processing station from the main vacuum chamber 6 when the main chamber transport assembly 31 is in the elevated position. The sealing system is further designed and configured such that when the main chamber transport assembly 31 is in the elevated position an individual processing station may be removed for servicing without disturbing the vacuum environment of the main chamber 6.

The sealing system includes a plurality of isolation seals 35, comprising a flexible polymeric material, such as an elastomer, disposed at the base of each pedestal 32, and corresponding seal seats 37, disposed in the upper wall of the vacuum chamber and aligned in registration over the path of each isolation seal 36.

When servicing of one or more individual processing stations becomes necessary, operation of the system is temporarily interrupted with the main chamber transport assembly 31 in the elevated position. All processing stations, load locks and buffer chambers are thus sealed off from the main vacuum chamber. For servicing a single processing station, its dedicated pump is valved off, and the processing station is vented to atmosphere. The vacuum environment of the main vacuum chamber is uniquely maintained by virtue of the atmospheric pressure exerted on the surface of the isolation seals 36.

Appropriate sections of the processing station may then be removed and replaced with suitably replenished and preprocessed sections. Alternatively, the entire processing station can be removed and replaced with a new or refurbished one which has been prepared off-line while the coating system has been in production. The processing station is then exhausted (rough pumped) and its dedicated vacuum pump is valved in. After a brief conditioning operation, the transport assembly 31 is lowered and normal operation of the system is resumed. Servicing of the selected processing station has not required venting the other processing stations or the main vacuum chamber to atmosphere. System down-time has thereby been greatly reduced.

The main chamber transport assembly 31 is further provided with a drive motor $M_{12}$, an indexing assembly 33 and an indexing motor $M_{13}$ to effect one-station simultaneous indexing on all substrates within the main vacuum chamber 6, whereby each individual substrate is transferred through the system. The substrates are processed sequentially in each of the N main chamber processing stations 40, all of the processing stations 40 simultaneously processing an individual one of the substrates, thereby allowing a high rate of production to be achieved.

In the preferred embodiment of the invention, to achieve the one-station indexing of the main chamber transport assembly 31, the assembly 31 is caused to undergo three distinct movements in a transfer cycle: The first movement being axially downward from a plane defined by the substrates in the respective processing stations (and transfer positions, shown in phantom in FIG. 5). The first movement is achieved by activating motor $M_{12}$ which drives a conventional screw and ball nut assembly (not shown), lowering the transport assembly 31.

The second movement is a horizontal circular path, whereby the substrates are positioned below and immediately adjacent the next processing station (shown in phantom in FIG. 4). The second movement is achieved by activating motor $M_{13}$ which drives index assembly 33.

Figure 4:
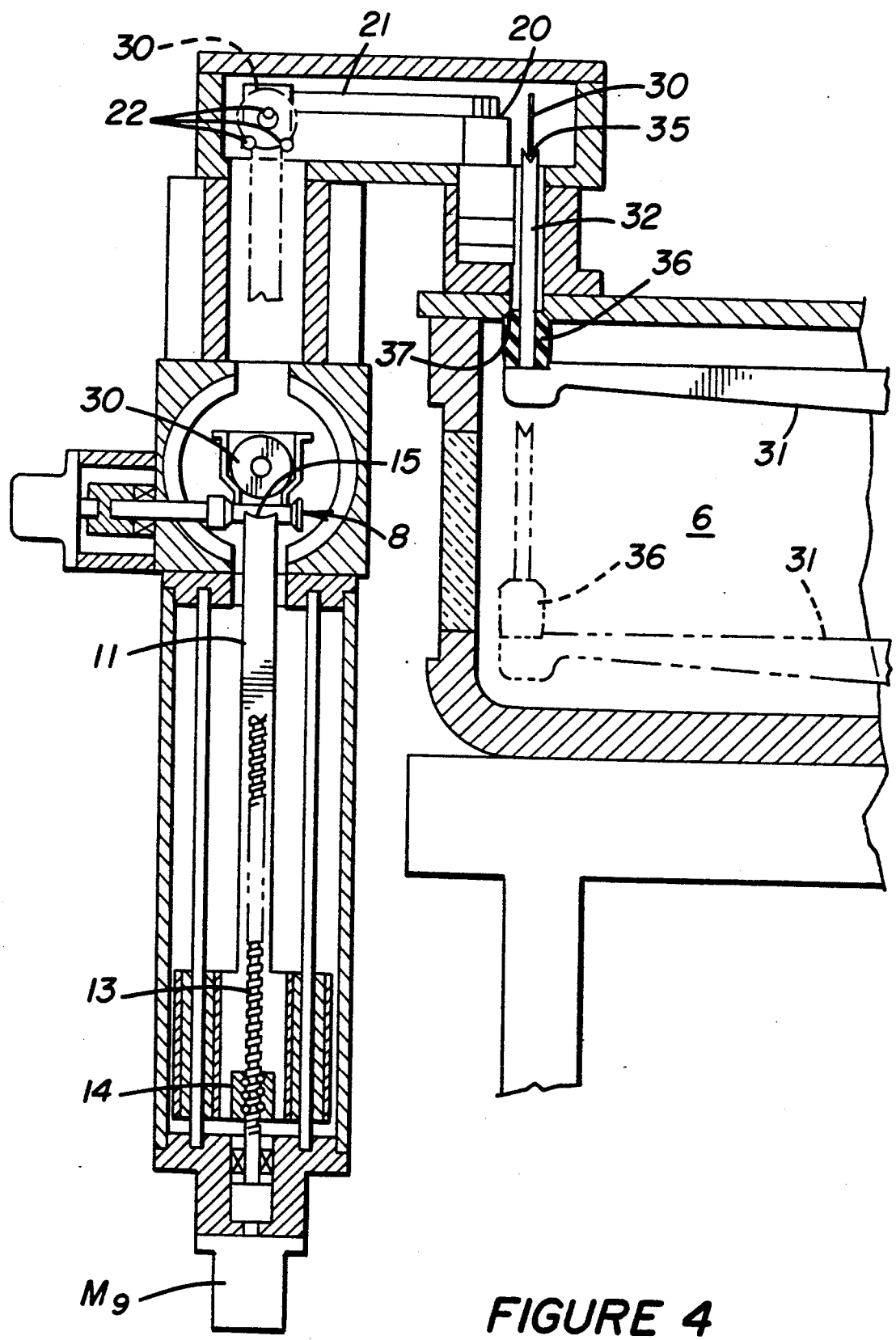
FIG. 4 is a schematic cross-sectional view illustrating the transfer of an individual substrate from the vertical transport means to the buffer chamber load means, to the main chamber transport means.

The third movement of the assembly 31 is axially upward wherein the substrates are again positioned in their respective processing station (see FIG. 4). This third position is similarly achieved by activating motor $M_{12}$ and the associated screw and ball-nut assembly. This third position also facilitates the transfer of substrates from the buffer chamber 4 via the buffer chamber load assembly lever arm 21 (see FIG. 4) to the main vacuum chamber 6, and the transfer of substrates from the main chamber 6 to the buffer chamber 4 via the buffer chamber unload assembly lever arm 26, shown in FIG. 3. The three-position sequence described above is repeated until all processing steps are complete and the processed substrate reaches the unload station 34, shown in FIG. 3.

The main chamber transport assembly 31 further isolates the main chamber 6 from the buffer chamber 4 when the substrates are positioned in the respective processing stations by the main chamber transport assembly 31. The main chamber 6 is under continuous high vacuum via gate valve assembly $G_8$ and a dedicated vacuum pump (not shown).

After the substrates are transferred to and positioned on the main chamber transport assembly 31, sequential processing of the substrate commences. If the processing includes sputter deposition, a sputtering gas, typically argon, is introduced and a plasma struck. The vacuum isolation of the process stations permits the use of different gas(es) at different pressures in each processing station. At the conclusion of the sputtering process, the gas(es) in each process station is substantially evacuated by the vacuum pump dedicated to the respective process station prior to lowering the main chamber transport assembly 31, thus minimizing the introduction of gas(es) into the main chamber 6 and substantially reducing the risk of cross contamination of gas(es) to other process stations.

As would be recognized by one skilled in the art, the number of processing stations, as well as the specific processes, employed in the disclosed handling and processing system may be tailored to suit a particular coating and/or processing sequence and are not described in detail herein. However, the first processing station is typically a heating station equipped with infrared high power heating lamps used to raise the temperature of the substrate positioned therein on the pedestals 32 to a desired temperature. In one embodiment, the remaining processing stations are sputter coating stations, either as DC or RF. A typical sputter coating station 40 is shown schematically in FIG. 5. In other embodiments, one or more other processing stations contains a DC or RF etching apparatus or CVD systems known in the art. When a substrate is held by the pedestal 32 of the main chamber transport assembly 31 as shown in phantom in FIG. 5, both sides of the substrate are substantially exposed for sputter coating by sputter coating apparatus 60 which is known in the art. The arcuate V-grooved 35 upper end of the pedestal 32 supports individual substrates edgewise therein reducing the surface area of the pedestal 32 exposed to sputtering in the process stations. Each of the processing stations is further provided with a dedicated high vacuum pump 41, thereby enabling vacuum coating processes to be carried out in selected ones of the processing stations.

In yet another embodiment of the invention one of the processing stations may comprise suitable substrate cooling means, as set forth in detail in copending application Ser. No. 07/763355, filed Sep. 20, 1991, now U.S. Pat. No. 5,181,556.

Figure 5:
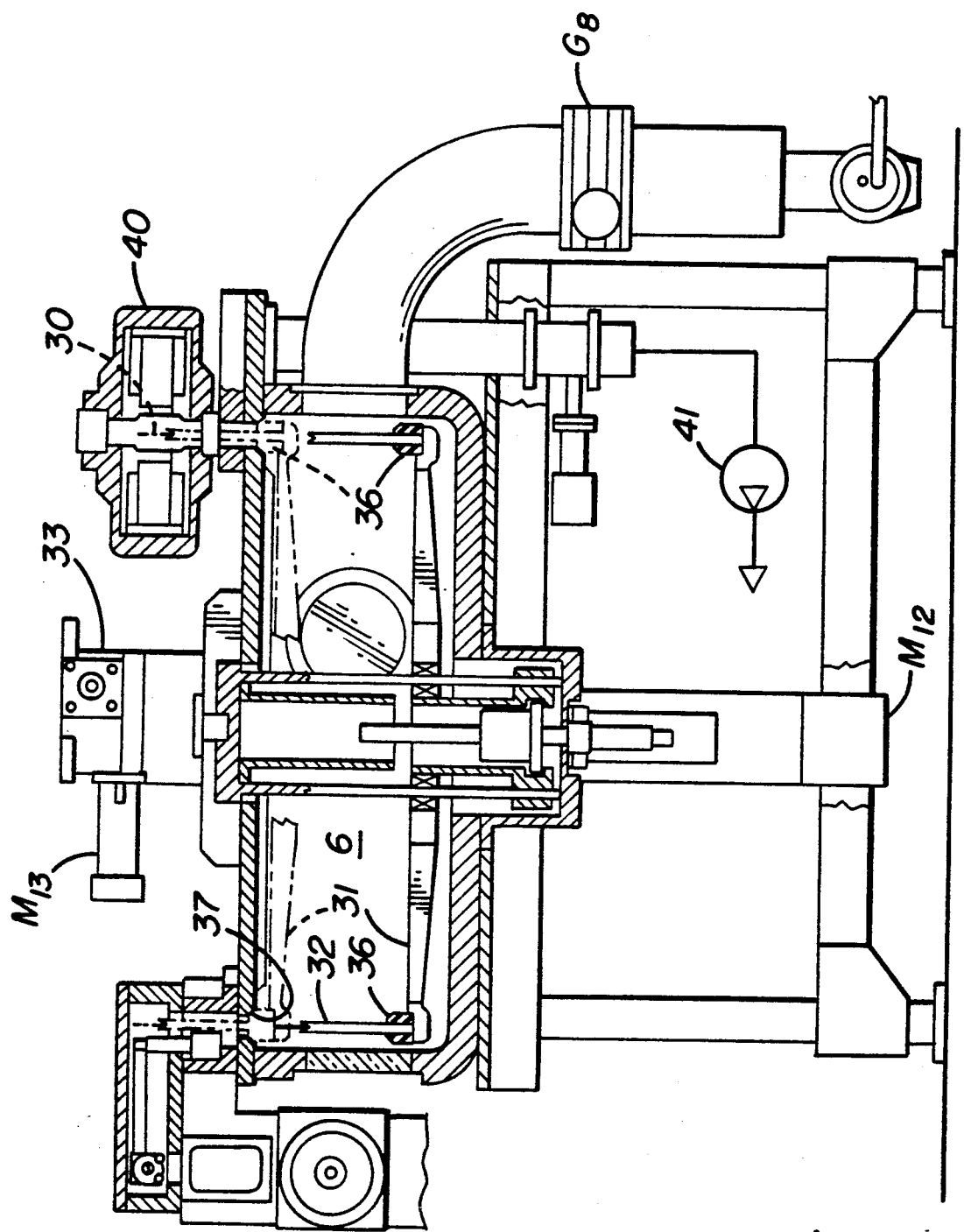
FIG. 5 is a schematic diagram of the present invention, illustrating the main chamber transport means.

In the preferred embodiment of the invention, the processing stations are contiguous with the main vacuum chamber 6 (see FIG. 5). However, as would be recognized by one skilled in the art, the processing stations may be disposed at various functional positions, such as above, below or within the main vacuum chamber 6. The term "contiguous with", as used herein, is intended to encompass the various positions.

The process of unloading a substrate from the main vacuum chamber 6 through buffer chamber 4 and into the exit cassette 2 in position $C_6$ is readily understood in light of the aforementioned process for loading a substrate from the buffer chamber 4, as the various mechanisms employed in both the buffer chamber load assembly 20 and unload assembly 27 are essentially identical. The main distinction between the two assemblies 20, 27 is the rotational translation of the lever arms 21, 26, as shown in FIG. 3.

Accordingly, after a substrate is processed and reaches the unload station 34, the lever arm 26 of the buffer chamber unload assembly 27 aligns with the substrate while the main chamber transport assembly 31 is in its raised position. The main chamber transport assembly 31 lowers, leaving the substrate engaged with the lever arm 26. The lever arm 26 is then rotated via motor $M_{14}$, positioning the substrate into registration over the path of the output lift blade 12 of the vertical transport system 10. Motor $M_{10}$ is then actuated, lifting the output lift blade 12 to engage the substrate. The lever arm 26 is rotated to its stand-by position (shown in phantom in FIG. 3). The lift blade 12 is then retracted, seating the substrate in the exit cassette located in position $C_6$.

After cassette 2 is loaded with processed substrates, gate valve assembly $G_5$ opens. Motors $M_6$ and $M_7$, for example, synchronously drive roller sets $R_6$ and $R_7$, moving the full cassette from the buffer chamber 4 to position $C_7$ in the exit load lock 5. Gate valve assembly $G_5$ is then closed, isolating the buffer chamber 4 from the exit load lock 5.

The exit load lock 5 is then slowly vented with an inert gas to atmospheric pressure. Gate valve assembly $G_7$ is opened. Motors $M_7$ and $M_8$ synchronously drive roller sets $R_7$ and $R_8$ and move the cassette 2 to position $C_8$. Gate valve assembly $G_7$ is closed and the exit load lock 5 is again pumped down via gage valve assembly $G_6$ and high vacuum cyropump $P_3$. The cassette 2 has now completed its trip through the conveyer system 1.

While the embodiments of the apparatus and methods have been disclosed with reference to specific structures, one of ordinary skill can make various changes and modifications to the invention to adapt it to various uses and conditions. As such, these changes and modifications are properly, equitably, and intended to be, within the full range of equivalence of the following claims.

What is claimed is:

1. A system for handling and serially processing a plurality of substrates, said system comprising:
   means defining a main vacuum chamber;
   at least one processing station contiguous with said main vacuum chamber;

an entrance load lock having an entrance opening and a first movable door for sealing said entrance opening, and an exit opening and a second movable door for sealing said exit opening;

an output load lock having an entrance opening and a third movable door for sealing said entrance opening, and an exit opening and a fourth movable door for sealing said exit opening;

a buffer chamber having an entrance opening and exit opening therein;

said buffer chamber being in selective sealed communication with said main chamber and operatively connected to and disposed between said entrance load lock and said exit load lock, said load locks and said buffer chamber being positioned whereby said second movable door provides a movable sealable common door between said entrance load lock exit opening and said buffer chamber entrance opening and said third movable door provides a common movable sealable door between said exit load lock entrance opening and said buffer chamber exit opening;

first transport means for transporting said substrates from said entrance load lock through said buffer chamber to said exit load lock;

buffer chamber load means for transferring said substrates from said buffer chamber to said main vacuum chamber;

buffer chamber unload means for transferring said substrates from said main vacuum chamber to said buffer chamber;

main chamber transport means for transferring said substrates to and from said processing stations;

said main chamber transport means designed and configured to receive one of said substrates from said buffer chamber load means after the substrate has been processed and to transfer one of said substrates to said buffer chamber unload means;

said main chamber transport means being used to effect simultaneous one-station indexing on all said substrates within said main vacuum chamber, whereby said individual substrates are transported through said system, being processed sequentially in each of said processing stations, all of said processing stations simultaneously processing said substrates, thereby allowing a high rate of production to be achieved.

said main chamber transport means including sealing means whereby said processing stations are isolated during processing when the substrates are positioned in their respective processing stations by said main chamber transport means and said processing stations are isolated from said main vacuum chamber such that when an individual processing station is vented to atmosphere said sealing means maintains an effective vacuum seal between the atmosphere and said vacuum chamber by virtue of the atmospheric pressure exerted on the sealing means.

2. The substrate handling and processing system of claim 1 wherein said substrates are vertically oriented during handling and processing.

3. The substrate handling and processing system of claim 1 wherein said first transport means includes a plurality of cassettes, said cassettes retaining said substrates in vertically facing and aligned relationship therein.

4. The substrate handling and processing system of claim 1 wherein said load locks are positioned on said first transport means whereby said first, second, third and fourth doors are in a plane parallel to and coincident with said first transport means.

5. The substrate handling and processing system of claim 1 including vertical transport means for individually transferring said substrates from an entrance cassette disposed within said buffer chamber to said buffer chamber load means and from said buffer chamber unload means to an exit cassette disposed within said buffer chamber.

6. The substrate handling and processing system of claim 5 wherein said vertical transport means including a plurality of lift blades, each of said lift blades designed and configured to securely hold an individual one of said substrates during vertical transport.

7. The substrate handling and processing system of claim 6 wherein each of said lift blades includes a radiused V-groove to symmetrically engage one of said substrates near a lower half of the periphery of said substrates.

8. The substrate handling and processing system of claim 7 wherein said lift blades are configured and positioned to allow said buffer chamber load and said unload means to engage said substrates.

9. The substrate handling and processing system of claim 1 wherein said main chamber transport means includes a plurality of pedestals, each of said pedestals being configured to securely hold an individual one of said substrates during transfer of said substrates from said processing stations and during processing of said substrates.

10. The substrate handling and processing system of claim 9 wherein each of said pedestals includes a radiused V-groove to symmetrically engage one of said substrates near a lower half of the periphery of said substrates.

11. The substrate handling and processing system of claim 10 wherein each of said pedestals are configured and positioned to allow said buffer chamber load and said unload means to engage said substrates.

12. The substrate handling and processing system of claim 1 wherein each of said buffer chamber load means and said buffer chamber unload means includes a rotatable lever arm.

13. The substrate handling and processing system of claim 12 wherein each of said lever arms has a plurality of grooved members at one end to engage one of said substrates near a lower half of the periphery of said substrate.

14. The substrate handling and processing system of claim 12 wherein said lever arms are rotatable between a first position whereby said arm is in communication with said buffer chamber and a second position whereby said arm is in communication with said main vacuum chamber.

15. The substrate handling and processing system of claim 14 wherein said lever arms are further rotatable to a third position when said arm is in communication with said buffer chamber, said third position being at a predetermined distance beyond said first position and coincident with a line of curvature defined by said arms' travel from said second position to said first position.

16. The substrate handling and processing system of claim 15 wherein said lever arms are further positioned to allow one of said substrates to be engaged by grooved members when said arm is rotated from said third position to said first position.

17. The substrate handling and processing system of claim 16 wherein said lever arms are further positioned to allow said substrate to be lowered into and raised out of said grooved members by means of said vertical transport means when said arms are in said first position, whereby vertically oriented individual ones of said substrates are securely transferred between said cassettes and said buffer chamber load and unload means.

18. The substrate handling and processing system of claim 12 wherein said lever arm is further positioned to allow said substrate to be engaged by and removed from pedestals of said main chamber transport means.

19. The substrate handling and processing system of claim 1 including conveyor means for moving said cassettes along said first transport means.

20. The substrate handling and processing system of claim 19 wherein said conveyer means comprises a plurality of motors operatively connected to horizontal transport means.

21. The substrate handling and processing system of claim 1 wherein said main vacuum chamber means, said entrance load lock and said exit load lock are provided with rough vacuum pumping means and a main high vacuum pump.

22. The substrate handling and processing system of claim 1 wherein said buffer chamber is provided with a dedicated high vacuum pump.

23. The substrate handling and processing system of claim 1 wherein each of said processing stations is provided with a dedicated high vacuum pump, thereby enabling vacuum coating processes to be carried out in selected ones of said processing stations.

24. The substrate handling and processing system of claim 1 wherein each of said processing stations is dedicated to a specific process, with generally differing processes being carried out by the various ones of said processing stations.

25. The substrate handling and processing system of claim 24 wherein said processing stations are disposed in a generally circular array, with said load locks and buffer chamber being disposed at the periphery thereof.

26. The substrate handling and processing system of claim 1 wherein said main chamber transport means includes means for intermittently indexing said main chamber transport means to effect simultaneous one-station indexing on all said substrates within said main chamber.

27. The substrate handling and processing system of claim 26 wherein said main chamber transport means are caused to undergo three distinct movements in a transfer cycle, a first movement being axially downward from a plane defined by said substrates in respective processing stations, a second movement being along a horizontal circular path, whereby said substrates are positioned below a next processing station, and a third movement being axially upward to said plane defined by said substrates in respective processing positions, whereby one of said substrates will also be engaged by one of said pedestals when said buffer chamber load means lever arm is in said second position and one of said substrates will be engaged by said buffer chamber unload means lever arm when said buffer chamber unload means lever arm is in said second position.

28. The substrate handling and processing system of claim 1 wherein said sealing means comprises an elastomer seal.

29. The substrate handling and processing system of claim 1 wherein an individiual processing station is vented to atmosphere by being removed from a position contiguous with said main vacuum chamber.

* * * * *